United States Patent
Moscaluk et al.

(10) Patent No.: US 9,013,938 B1
(45) Date of Patent: Apr. 21, 2015

(54) SYSTEMS AND METHODS FOR DISCHARGING LOAD CAPACITANCE CIRCUITS

(75) Inventors: Gary Moscaluk, Colorado Springs, CO (US); John Tiede, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 651 days.

(21) Appl. No.: 13/432,053

(22) Filed: Mar. 28, 2012

Related U.S. Application Data

(60) Provisional application No. 61/566,512, filed on Dec. 2, 2011.

(51) Int. Cl.
  *G11C 5/14* (2006.01)

(52) U.S. Cl.
  CPC . *G11C 5/14* (2013.01); *G11C 5/145* (2013.01)

(58) Field of Classification Search
  CPC .......... G11C 5/14; G11C 5/145; G11C 16/06; G11C 16/14
  USPC .............................. 365/203, 185.25, 204, 226
  See application file for complete search history.

(56) References Cited

U.S. PATENT DOCUMENTS

| | | | |
|---|---|---|---|
| 5,311,077 A | 5/1994 | Brown | |
| 5,748,531 A | 5/1998 | Choi | |
| 5,973,897 A | 10/1999 | Opris et al. | |
| 6,297,974 B1 * | 10/2001 | Ganesan et al. | 363/60 |
| 6,552,595 B1 | 4/2003 | Ma | |

(Continued)

FOREIGN PATENT DOCUMENTS

| | | |
|---|---|---|
| CN | 1399811 A | 2/2003 |
| JP | 2005340380 A | 12/2005 |

OTHER PUBLICATIONS

F. Garcia, P. Coll and D. Auvergne_Design of a Stew Rate Controlled Output Buffer_Dated 1998_4 pages.

(Continued)

*Primary Examiner* — Tan T. Nguyen

(57) ABSTRACT

Circuits, systems, and methods for discharging loads are provided. One circuit includes a node coupled to a voltage source, a capacitor, a source-follower device coupled between the node and the capacitor, and a current source coupled to the capacitor. The source-follower device is configured to switchably couple the capacitor to the node to discharge the voltage source and the current source is configured to discharge the capacitor. One system includes the above circuit coupled to a memory device such that the circuit is configured to discharge voltage from the memory device. A method includes discharging, via a capacitor coupled to the memory device, a high voltage from the memory device and discharging, via a current source coupled to the capacitor, the high voltage from the capacitor. The capacitor is configured to discharge the high voltage within a predetermined range of time.

20 Claims, 4 Drawing Sheets

(56) References Cited

U.S. PATENT DOCUMENTS

| | | | |
|---|---|---|---|
| 6,667,910 | B2 | 12/2003 | Abedifard et al. |
| 6,900,970 | B2 | 5/2005 | Miller et al. |
| 7,248,521 | B2 | 7/2007 | Patel et al. |
| 7,427,888 | B2 | 9/2008 | Zhang et al. |
| 7,696,805 | B2 | 4/2010 | Thorp et al. |
| 7,724,485 | B2 | 5/2010 | Worley et al. |
| 7,881,122 | B2 | 2/2011 | Ariki |
| 8,059,447 | B2 * | 11/2011 | Scheuerlein et al. ......... 365/148 |
| 2004/0125524 | A1 | 7/2004 | Blyth |

OTHER PUBLICATIONS

Mariusz Jankowski, et al.__Current-Controlled Slew-Rate Adjustable Trapezoidal Waveform Generators for Low- and High-Voltage Applications__Dated Jun. 16, 2011__16 pages.

Search Report for U.S. Appl. No. 13/432,053; Dated Mar. 2012, 16 pages.

Soon-Kyun Shin, et al.__A Slew-Rate Controlled Output Driver Using PLL as Compensation Circuit__Dated Jul. 2003__7 pages.

SIPO Office Action for Application No. 201210508784.X Jan. 18, 2015; 7 pages.

* cited by examiner

US 9,013,938 B1

SYSTEMS AND METHODS FOR DISCHARGING LOAD CAPACITANCE CIRCUITS

RELATED APPLICATIONS

This application is a non-provisional application of U.S. Application No. 61/566,512 filed Dec. 2, 2011, which is incorporated herein by reference.

BACKGROUND

1. Field

Various embodiments relate to electronic circuits and, particularly, to circuits, systems, and methods for discharging voltage from load capacitance circuits.

2. Description of the Related Art

Contemporary high voltage discharge circuits use multiple current sources or gated resistors to discharge voltages. Multiple current sources or gated resistors are required because the load capacitance may vary depending on the operation the chip is performing. Each current source requires individual tuning, which is dependent on the load capacitance.

In prior discharge circuits, the size of the current sources or gated resistors must be adjusted to the size of the capacitive load being discharged. In the case of nonvolatile memories, the capacitive load will be different depending on the high voltage operation being performed and on the size of the memory device. High voltage operations make a difference because different parts of the memory array are energized with high voltages for different operations (e.g., program and erase). Each high voltage operation requires a different size of current source or gated resistor, and this consumes extra circuit area. The exact value of the capacitive load may not be sufficiently known until circuit layout is complete. Therefore, different capacitive loads require time-consuming tuning, which usually occurs near the end of a design project.

Changes in array size mean that circuit reuse without additional tuning is also limited. Process variation that changes dielectric thicknesses will vary the load capacitance and, thus, will vary the discharge voltage slew rate. The discharge voltage slew rate is important to avoid a phenomenon known as "bipolar snapback," which can cause a latch-up in electronic circuits.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
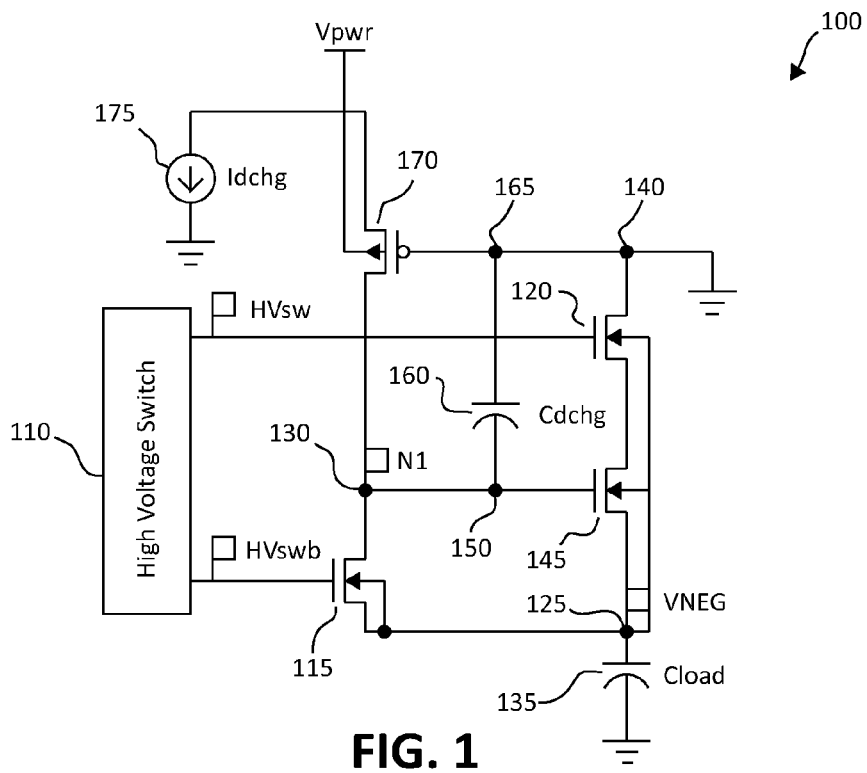
FIG. 1 is a schematic diagram of one embodiment of a circuit for discharging voltage from load capacitance circuits.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The various embodiments described herein include discharge circuits. One discharge circuit comprises a node configured to be coupled to a voltage source, a capacitor, a source-follower device coupled between the node and the capacitor, and a current source coupled to the capacitor. The source-follower device is configured to switchably couple the capacitor to the node, the capacitor is configured to discharge the voltage source, and the current source is configured to discharge the capacitor.

Other embodiments provide memory systems. One memory system comprises an array of memory devices including a high voltage and a discharge circuit coupled to the array of memory devices. The discharge circuit comprises a high-voltage node coupled to the array of memory devices, a capacitor, a source-follower device coupled between the high-voltage node and the capacitor, and a current source coupled to the capacitor. The source-follower device is configured to switchably couple the capacitor to the node, the capacitor is configured to discharge the array of memory devices, and the current source is configured to discharge the capacitor.

Methods for discharging a memory device are also provided. One method comprises discharging, via a capacitor coupled to the memory device, a high voltage from the memory device and discharging, via a current source coupled to the capacitor, the high voltage from the capacitor. Here, the capacitor is configured to discharge the high voltage from the memory device within a predetermined range of time.

Turning now to the figures, FIG. 1 is a block diagram of one embodiment of a circuit 100 for discharging voltage from load capacitance circuits. At least in the illustrated embodiment, circuit 100 is configured to discharge a negative high voltage.

Circuit 100 comprises a high voltage switch 110 comprising an output (HVswb) coupled to a N-channel metal oxide semiconductor field-effect transistor (nMOSFET) 115 and an output (HVsw) coupled to an nMOSFET 120. Specifically, HVswb is coupled to the gate of nMOSFET 115 and HVsw is coupled to the gate of nMOSFET 120. HVswb and HVsw are configured to provide logic inputs to the gate of nMOSFET 115 and to the gate of nMOSFET 120, respectively.

The source of nMOSFET 115 is coupled to a node 125 that is coupled to VNEG, which is located at the lowest position in circuit 100. The drain of nMOSFET 115 is coupled to a node 130 and the bulk of nMOSFET 115 is coupled to VNEG to ensure that there is no source-drain forward bias in nMOSFET 115.

Node 125 is coupled to a voltage source, load (Cload), and/or other capacitive device represented by a capacitor 135. In various embodiments, the voltage source, Cload, and/or other capacitive device represented by capacitor 135 comprises a voltage (VNEG) in the range of about −4.5 volts to about −3.0 volts. In one embodiment, the voltage source, Cload, and/or other capacitive device represented by capacitor 135 comprises a voltage of about −3.5 volts.

The bulk of nMOSFET 120 is coupled to VNEG to ensure that there is no source-drain forward bias in nMOSFET 120. The drain of nMOSFET 120 is coupled to a node 140 that is coupled to ground and the source of nMOSFET 120 is coupled to the drain of an nMOSFET 145 that acts a source follower (e.g., a common drain amplifier).

The source of nMOSFET 145 is coupled to node 125 and the bulk of nMOSFET 145 is coupled to VNEG to ensure that there is no source-drain forward bias in nMOSFET 145. The gate of nMOSFET 145 is coupled to a node 150 that is coupled to a discharge capacitor 160 (Cdcharge).

Capacitor 160 is configured to discharge the voltage source, Cload, and/or other capacitive device represented by capacitor 135. For example, capacitor 135 may represent an array of memory device and capacitor 160 is configured to discharge the array of memory devices during programming and erasing operations. Capacitor 160 is coupled to a node 165 that is coupled to node 140 and to the gate of a P-channel metal oxide semiconductor field-effect transistor (pMOSFET) 170.

The source of pMOSFET 170 is coupled to node 130. The drain of pMOSFET 170 is coupled to a current source 175 (Idchg) that is coupled to ground and is configured to discharge capacitor 160. The bulk of pMOSFET 170 is coupled to VPWR to ensure that there is no source-drain forward bias in pMOSFET 170.

Current source 175 may be any type of current source known in the art or developed in the future. In one embodiment, current source 175 is a resistor coupled in series with the drain of pMOSFET 170. In another embodiment, current source 175 is a transistor (e.g., an nMOSFET).

In various embodiments, circuit 100 is configured to operate in a pre-charge mode and a discharge mode. In the pre-charge mode, circuit 100 is configured to discharge a voltage source, (Cload) and/or other capacitive device represented by capacitor 135 coupled (e.g., via node 125) to circuit 100 via capacitor 160. In the discharge mode, circuit 100 is configured to discharge capacitor 160 via current source 175.

In various embodiments, the size and/or rate (e.g., speed) at which capacitor 160 discharges the voltage source, Cload, and/or other capacitive device represented by capacitor 135 may be important. Specifically, capacitor 160 may include a size and/or rate of charge such that the voltage source, Cload, and/or other capacitive device represented by capacitor 135 is neither discharged too quickly nor too slowly. For example, it may be important not to discharge the voltage source, Cload, and/or other capacitive device represented by capacitor 135 too quickly so that a phenomena known as "bipolar snapback" is avoided or at least reduced. Furthermore, it may be important not to discharge the voltage source, Cload, and/or other capacitive device represented by capacitor 135 too slowly so that the performance of the voltage source, Cload, and/or other capacitive device represented by capacitor 135 is not adversely affected. In other words, capacitor 160 may include a size and/or rate of charge such that the voltage source, Cload, and/or other capacitive device represented by capacitor 135 is discharged within a predetermined amount of time.

In one embodiment, the predetermined amount of time at which the voltage source, Cload, and/or other capacitive device represented by capacitor 135 is discharged is in the range of about 5 is to about 50 µs. That is, in one embodiment, capacitor 160 is configured to take at least 5 µs, but not longer than about 50 is to discharge the voltage source, Cload, and/or other capacitive device represented by capacitor 135. Moreover, in various embodiments, capacitor 160 includes a capacitance in the range of about 2 pF to about 5 pF, although a bigger or a smaller capacitor may be utilized depending on the application of circuit 100.

The following explanation of the operation of circuit 100 may be helpful in understanding circuit 100. However, the various embodiments of circuit 100 are not limited to the following explanation.

To enable the pre-charge mode, high voltage switch 110 provides a logic high signal (or 1.2 volt signal) to nMOSFET 115 via HVswb and provides a logic low signal (or 0 volt signal) to nMOSFET 120 via HVsw. The logic high signal turns ON nMOSFET 115 and current source 175 is turned OFF. A voltage pump (see voltage pump 520 in FIG. 5) coupled to node 125 applies a negative voltage (VNEG) to circuit 100 and node 130 will follow this voltage down and keep nMOSFET 145 OFF.

Node 170 will discharge to a voltage around one pMOSFET threshold voltage above vgnd (0 volts). At this point, pMOSFET 170 is biased in the cutoff region of operation. With nMOSFET 115 ON and nMOSFET 145 OFF, the voltage at node 130 is at VNEG and capacitor 155 is "pre-charged."

In other words, pMOSFET 170 is always ON so, in pre-charge mode, discharge current source 175 (Idchg) is turned OFF. The source of pMOSFET 170 will discharge current source 175 until it reaches a pMOSFET threshold voltage above VGND, which also could have been grounded. At this point, Vgate-Vsource of pMOSFET 170 is less than the threshold voltage of pMOSFET 170, which turns OFF pMOSFET 170.

nMOSFET 145 is OFF because nMOSFET 115 is ON and the gate and source of nMOSFET 145 are both shorted (i.e., Vgate-Vsource=0V), which guarantees that nMOSFET 145 is OFF. The voltage (VNEG) at node 125 pumped down to −3.5V and capacitor 155 (Cdchg) is pre-charged to −3.5V. Specifically, one terminal of capacitor 155 is at 0 volts and the other terminal is at −3.5 volts.

To enable the discharge mode, the voltage source connected to node 125 is shut OFF. High voltage switch 110 provides a logic low signal to nMOSFET 115 via HVswb, which turns OFF nMOSFET 115, and provides a logic high signal to nMOSFET 120 via HVsw. At this point, both nodes 130 and 125 are still at −3.5 volts, so nMOSFET 145 is still OFF and nMOSFET 120 is ON.

Discharge current source 175 is next turned ON. Furthermore, VNEG will follow the discharge of node 130 as it discharges through current source 175 since nMOSFET 145 forms a source follower device.

While the embodiment of circuit 100 illustrated in FIG. 1 has been described as utilizing MOSFET devices, circuit 100 is not limited to MOSFET devices. That is, various other embodiments of circuit 100 may utilize other types of switches, switching devices, and/or transistor devices (e.g., bipolar junction transistor devices, junction gate field-effect transistor devices, insulated gate bipolar transistor devices, etc.).

Figure 2:
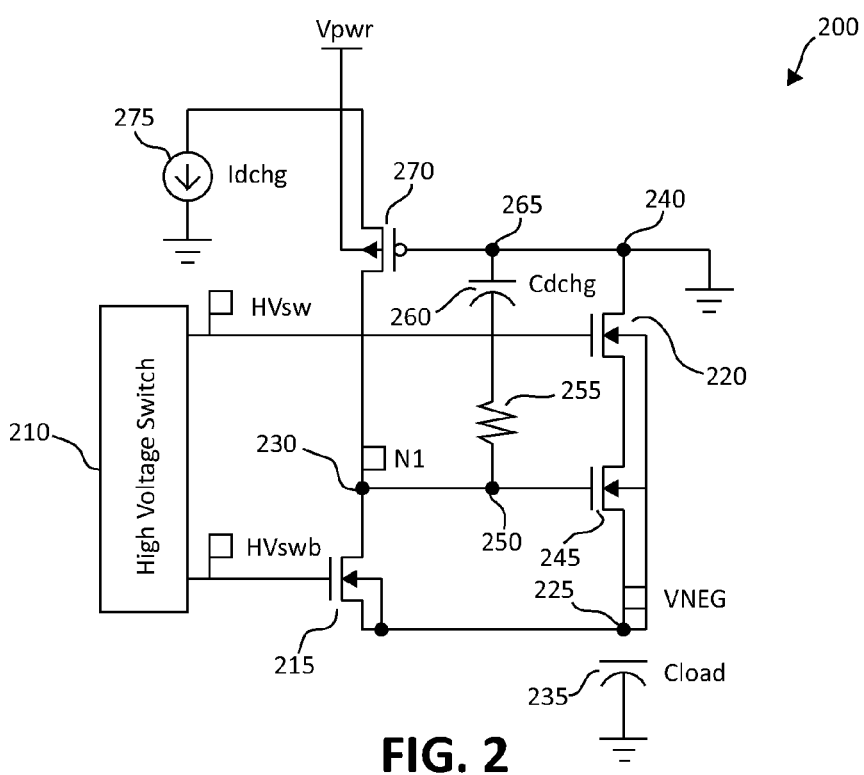
FIG. 2 is a schematic diagram of another embodiment of a circuit for discharging voltage from load capacitance circuits.

With reference to FIG. 2, FIG. 2 is a block diagram of one embodiment of a circuit 200 for discharging voltage from load capacitance circuits. At least in the illustrated embodiment, circuit 200 is configured to discharge a negative high voltage.

Circuit 200 comprises a high voltage switch 210 comprising an output (HVswb) coupled to an nMOSFET 215 and an output (HVsw) coupled to an nMOSFET 220. Specifically, HVswb is coupled to the gate of nMOSFET 215 and HVsw is coupled to the gate of nMOSFET 220. HVswb and HVsw are configured to provide logic inputs to the gate of nMOSFET 215 and to the gate of nMOSFET 220, respectively.

The source of nMOSFET 215 is coupled to a node 225 that is coupled to VNEG, which is located at the lowest position in circuit 200. The drain of nMOSFET 215 is coupled to a node 230 and the bulk of nMOSFET 215 is coupled to VNEG to ensure that there is no source-drain forward bias in nMOSFET 215.

Node 225 is coupled to a voltage source, load (Cload), and/or other capacitive device represented by a capacitor 235. In various embodiments, the voltage source, Cload, and/or other capacitive device represented by capacitor 235 comprises a voltage (VNEG) in the range of about −4.5 volts to about −3.0 volts. In one embodiment, the voltage source, Cload, and/or other capacitive device represented by capacitor 235 comprises a voltage of about −3.5 volts.

The drain of nMOSFET 220 is coupled to a node 240 that is coupled to ground and the bulk of nMOSFET 220 is coupled to VNEG to ensure that there is no source-drain forward bias in nMOSFET 220. The source of nMOSFET 220 is coupled to the drain of an nMOSFET 245 that acts a source follower (e.g., a common drain amplifier).

The bulk of nMOSFET 245 is coupled to VNEG to ensure that there is no source-drain forward bias in nMOSFET 245. The source of nMOSFET 245 is coupled to node 225 and the gate of nMOSFET 245 is coupled to a node 250 that is coupled to a resistor 255 (e.g., a low-pass filter).

Resistor 255 may be any resistive device known in the art or developed in the future. In various embodiments, resistor 255 may comprise a resistance in the range of about 50 kΩ to about 500 kΩ. Resistor 255 is also coupled to a capacitor 260 that is coupled to a node 265.

Capacitor 260 is configured to discharge the voltage source, Cload, and/or other capacitive device represented by capacitor 235. For example, capacitor 235 may represent an array of memory device and capacitor 260 is configured to discharge the array of memory devices during programming and erasing operations.

Node 265 is coupled to node 240 and to a pMOSFET 270. Specifically, node 265 is coupled to the gate of pMOSFET 270.

The source of pMOSFET 270 is coupled to node 230. The drain of pMOSFET 270 is coupled to a current source 275 (Idchg) that is coupled to ground and is configured to discharge capacitor 260. The bulk of pMOSFET 270 is coupled to VPWR to ensure that there is no source-drain forward bias in pMOSFET 270.

Current source 275 may be any type of current source known in the art or developed in the future. In one embodiment, current source 275 is a resistor coupled in series with the drain of pMOSFET 270. In another embodiment, current source 275 is a transistor (e.g., an nMOSFET).

In various embodiments, circuit 200 is configured to operate in a pre-charge mode and a discharge mode. In the pre-charge mode, circuit 200 is configured to discharge a voltage source, (Cload) and/or other capacitive device represented by capacitor 235 coupled (e.g., via node 225) to circuit 200 via capacitor 260. In the discharge mode, circuit 200 is configured to discharge capacitor 260 via current source 275.

In various embodiments, the size and/or rate (e.g., speed) at which capacitor 260 discharges the voltage source, Cload, and/or other capacitive device represented by capacitor 235 may be important. Specifically, capacitor 260 may include a size and/or rate of charge such that the voltage source, Cload, and/or other capacitive device represented by capacitor 235 is neither discharged too quickly nor too slowly. For example, it may be important not to discharge the voltage source, Cload, and/or other capacitive device represented by capacitor 235 too quickly so that a phenomena known as "bipolar snapback" is avoided or at least reduced. Furthermore, it may be important not to discharge the voltage source, Cload, and/or other capacitive device represented by capacitor 235 too slowly so that the performance of the voltage source, Cload, and/or other capacitive device represented by capacitor 235 is not adversely affected. In other words, capacitor 260 may include a size and/or rate of charge such that the voltage source, Cload, and/or other capacitive device represented by capacitor 235 is discharged within a predetermined amount of time.

In one embodiment, the predetermined amount of time at which the voltage source, Cload, and/or other capacitive device represented by capacitor 235 is discharged is in the range of about 5 μs to about 50 μs. That is, in one embodiment, capacitor 260 is configured to take at least 5 μs, but not longer than about 50 μs to discharge the voltage source, Cload, and/or other capacitive device represented by capacitor 235. Moreover, in various embodiments, capacitor 260 includes a capacitance in the range of about 2 pF to about 5 pF.

The following explanation of the operation of circuit 200 may be helpful in understanding circuit 200. However, the various embodiments of circuit 200 are not limited to the following explanation.

To enable the pre-charge mode, high voltage switch 210 provides a logic high signal (or 1.2 volt signal) to nMOSFET 215 via HVswb and provides a logic low signal (or 0 volt signal) to nMOSFET 220 via HVsw. The logic high signal turns ON nMOSFET 215 and current source 275 is turned OFF. A voltage pump (see voltage pump 520 in FIG. 5) coupled to node 225 applies a negative voltage (VNEG) to circuit 200 and node 230 will follow this voltage down and keep nMOSFET 245 OFF.

Node 270 will discharge to a voltage around one pMOSFET threshold voltage above vgnd (0 volts). At this point, pMOSFET 270 is biased in the cutoff region of operation. With nMOSFET 215 ON and nMOSFET 245 OFF, the voltage at node 230 is at VNEG and capacitor 255 is "pre-charged."

In other words, pMOSFET 270 is always ON so, in pre-charge mode, discharge current source 275 (Idchg) is turned OFF. The source of pMOSFET 270 will discharge current source 275 until it reaches a pMOSFET threshold voltage above VGND, which also could have been grounded. At this point, Vgate-Vsource of pMOSFET 270 is less than the threshold voltage of pMOSFET 270, which turns OFF pMOSFET 270.

nMOSFET 245 is OFF because nMOSFET 215 is ON and the gate and source of nMOSFET 245 are both shorted (i.e., Vgate-Vsource=0V), which guarantees that nMOSFET 245 is OFF. The voltage (VNEG) at node 225 pumped down to −3.5V and capacitor 255 (Cdchg) is pre-charged to −3.5V. Specifically, one terminal of capacitor 255 is at 0 volts and the other terminal is at −3.5 volts.

To enable the discharge mode, the voltage source connected to node 225 is shut OFF. High voltage switch 210 provides a logic low signal to nMOSFET 215 via HVswb, which turns OFF nMOSFET 215, and provides a logic high signal to nMOSFET 220 via HVsw. At this point, both nodes 230 and 225 are still at −3.5 volts, so nMOSFET 245 is still OFF and nMOSFET 220 is ON.

Discharge current source 275 is next turned ON. Furthermore, VNEG will follow the discharge of node 230 as it discharges through current source 275 since nMOSFET 245 forms a source follower device.

While the embodiment of circuit 200 illustrated in FIG. 2 has been described as utilizing MOSFET devices, circuit 200 is not limited to MOSFET devices. That is, various other embodiments of circuit 200 may utilize other types of switches, switching devices, and/or transistor devices (e.g., bipolar junction transistor devices, junction gate field-effect transistor devices, insulated gate bipolar transistor devices, etc.).

Figure 3:
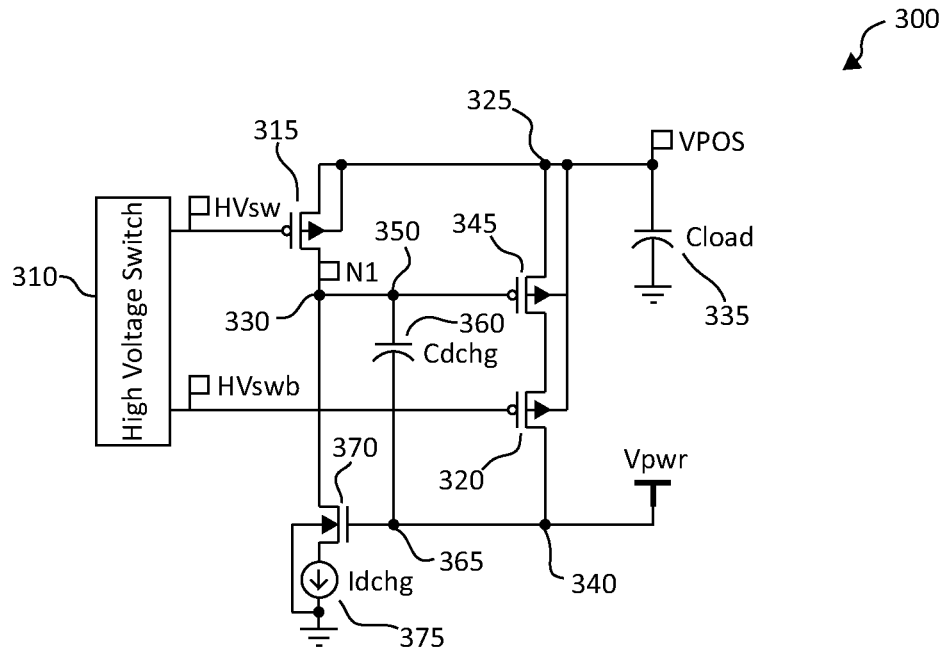
FIG. 3 is a schematic diagram of yet another embodiment of a circuit for discharging voltage from load capacitance circuits.

Referring now to FIG. 3, FIG. 3 is a block diagram of one embodiment of a circuit 300 for discharging voltage from load capacitance circuits. At least in the illustrated embodiment, circuit 300 is configured to discharge a positive high voltage.

Circuit 300 comprises a high voltage switch 310 comprising an output (HVsw) coupled to a pMOSFET 315 and an output (HVswb) coupled to a pMOSFET 320. Specifically, HVsw is coupled to the gate of pMOSFET 315 and HVswb is coupled to the gate of pMOSFET 320. HVsw and HVswb are configured to provide logic inputs to the gate of pMOSFET 315 and to the gate of pMOSFET 320, respectively.

The source of pMOSFET 315 is coupled to a node 325 that is coupled to VPOS, which is located at the highest position in circuit 300. The drain of pMOSFET 315 is coupled to a node 330 and the bulk of pMOSFET 315 is coupled to VPOS to ensure that there is no source-drain forward bias in pMOSFET 315.

Node 325 is coupled to a voltage source, load (Cload), and/or other capacitive device represented by a capacitor 335. In various embodiments, the voltage source, Cload, and/or other capacitive device represented by capacitor 335 comprises a voltage (VPOS) in the range of about 1.2 volts to about 4.0 volts. In one embodiment, the voltage source, Cload, and/or other capacitive device represented by capacitor 335 comprises a voltage of about 3.0 volts.

The drain of pMOSFET 320 is coupled to a node 340 that is coupled to VPWR and the bulk of pMOSFET 320 is coupled to VPOS to ensure that there is no source-drain forward bias in pMOSFET 320. The source of pMOSFET 320 is coupled to the drain of a pMOSFET 345 that acts a source follower (e.g., a common drain amplifier).

The bulk of pMOSFET 345 is coupled to VPOS to ensure that there is no source-drain forward bias in pMOSFET 345. The source of pMOSFET 345 is coupled to node 325 and the gate of pMOSFET 345 is coupled to a node 350 that is coupled to a discharge capacitor 360 (Cdcharge).

Capacitor 360 is configured to discharge the voltage source, Cload, and/or other capacitive device represented by capacitor 335. For example, capacitor 335 may represent an array of memory device and capacitor 360 is configured to discharge the array of memory devices during programming and erasing operations. Capacitor 360 is coupled to a node 365 that is coupled to node 340 and to the gate of an nMOSFET 370.

The source of nMOSFET 370 is coupled to node 330. The drain of nMOSFET 370 is coupled to a current source 375 (Idchg) that is coupled to ground and is configured to discharge capacitor 360. The bulk of nMOSFET 370 is coupled to ground to ensure that there is no source-drain forward bias in nMOSFET 370.

Current source 375 may be any type of current source known in the art or developed in the future. In one embodiment, current source 375 is a resistor coupled in series with the drain of nMOSFET 370. In another embodiment, current source 375 is a transistor (e.g., an nMOSFET).

In various embodiments, circuit 300 is configured to operate in a pre-charge mode and a discharge mode. In the pre-charge mode, circuit 300 is configured to discharge a voltage source, (Cload) and/or other capacitive device represented by capacitor 335 coupled (e.g., via node 325) to circuit 300 via capacitor 360. In the discharge mode, circuit 300 is configured to discharge capacitor 360 via current source 375.

In various embodiments, the size and/or rate (e.g., speed) at which capacitor 360 discharges the voltage source, Cload, and/or other capacitive device represented by capacitor 335 may be important. Specifically, capacitor 360 may include a size and/or rate of charge such that the voltage source, Cload, and/or other capacitive device represented by capacitor 335 is neither discharged too quickly nor too slowly. For example, it may be important not to discharge the voltage source, Cload, and/or other capacitive device represented by capacitor 335 too quickly so that a phenomena known as "bipolar snapback" is avoided or at least reduced. Furthermore, it may be important not to discharge the voltage source, Cload, and/or other capacitive device represented by capacitor 335 too slowly so that the performance of the voltage source, Cload, and/or other capacitive device represented by capacitor 335 is not adversely affected. In other words, capacitor 360 may include a size and/or rate of charge such that the voltage source, Cload, and/or other capacitive device represented by capacitor 335 is discharged within a predetermined amount of time.

In one embodiment, the predetermined amount of time at which the voltage source, Cload, and/or other capacitive device represented by capacitor 335 is discharged is in the range of about 5 µs to about 50 µs. That is, in one embodiment, capacitor 360 is configured to take at least 5 µs, but not longer than about 50 µs to discharge the voltage source, Cload, and/or other capacitive device represented by capacitor 335. Moreover, in various embodiments, capacitor 360 includes a capacitance in the range of about 2 pF to about 5 pF.

The following explanation of the operation of circuit 300 may be helpful in understanding circuit 300. However, the various embodiments of circuit 300 are not limited to the following explanation.

To enable the pre-charge mode, high voltage switch 310 provides a logic low signal (or 0 volt signal) to pMOSFET 315 via HVsw and provides a logic high signal (or 1.2 volt signal) to pMOSFET 320 via HVswb. The logic low signal turns ON pMOSFET 315 and current source 375 is turned OFF. A voltage pump (see voltage pump 520 in FIG. 5)

coupled to node 325 applies a positive voltage (VPOS) to circuit 300 and node 330 will follow this voltage up and keep pMOSFET 345 OFF.

Node 370 will charge to a voltage around one pMOSFET threshold voltage below VPWR (1.2 volts). At this point, nMOSFET 370 is biased in the cutoff region of operation. With pMOSFET 315 ON and pMOSFET 345 OFF, the voltage at node 330 is at VPOS and capacitor 355 is "precharged."

In other words, nMOSFET 370 is always ON so, in precharge mode, discharge current source 375 (Idchg) is turned OFF. The source of nMOSFET 370 will discharge current source 375 until it reaches an nMOSFET threshold voltage below VPWR. At this point, Vgate-Vsource of nMOSFET 370 is greater than the threshold voltage of nMOSFET 370, which turns OFF nMOSFET 370.

pMOSFET 345 is OFF because pMOSFET 315 is ON and the gate and source of pMOSFET 345 are both shorted (i.e., Vgate-Vsource=1.2V), which guarantees that pMOSFET 345 is OFF. The voltage (VPOS) at node 325 pumped up to 4.0V and capacitor 355 (Cdchg) is pre-charged to 4.0V. Specifically, one terminal of capacitor 355 is at 0 volts and the other terminal is at 4.0 volts.

To enable the discharge mode, the voltage source connected to node 325 is shut OFF. High voltage switch 310 provides a logic high signal to pMOSFET 315 via HVsw, which turns OFF pMOSFET 315, and provides a logic low signal to pMOSFET 320 via HVswb. At this point, both nodes 330 and 325 are still at 4.0 volts, so pMOSFET 345 is still OFF and pMOSFET 320 is ON.

Discharge current source 375 is next turned ON. Furthermore, VPOS will follow the discharge of node 330 as it discharges through current source 375 since pMOSFET 345 forms a source follower device.

While the embodiment of circuit 300 illustrated in FIG. 3 has been described as utilizing MOSFET devices, circuit 300 is not limited to MOSFET devices. That is, various other embodiments of circuit 300 may utilize other types of switches, switching devices, and/or transistor devices (e.g., bipolar junction transistor devices, junction gate field-effect transistor devices, insulated gate bipolar transistor devices, etc.).

Figure 4:
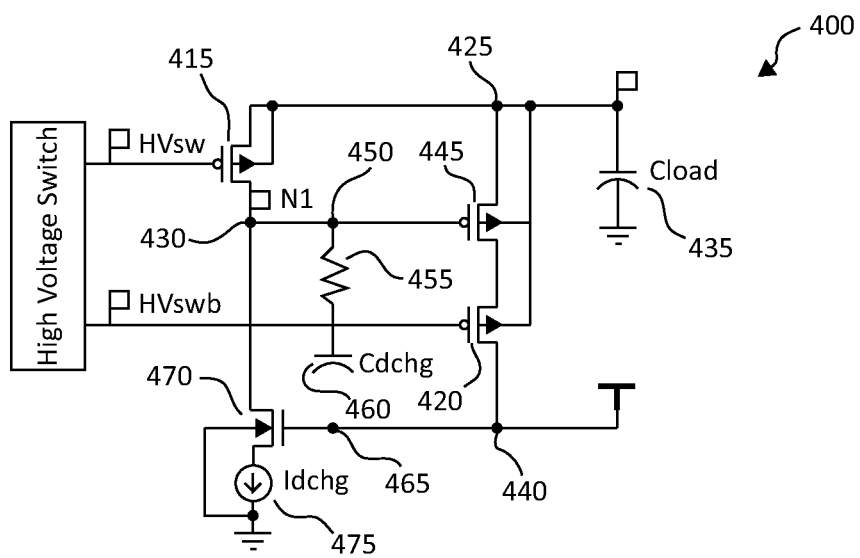
FIG. 4 is a schematic diagram of still another embodiment of a circuit for discharging voltage from load capacitance circuits.

With reference to FIG. 4, FIG. 4 is a block diagram of one embodiment of a circuit 400 for discharging voltage from load capacitance circuits. At least in the illustrated embodiment, circuit 400 is configured to discharge a positive high voltage.

Circuit 400 comprises a high voltage switch 410 comprising an output (HVsw) coupled to a pMOSFET 415 and an output (HVswb) coupled to a pMOSFET 420. Specifically, HVsw is coupled to the gate of pMOSFET 415 and HVswb is coupled to the gate of pMOSFET 420. HVsw and HVswb are configured to provide logic inputs to the gate of pMOSFET 415 and to the gate of pMOSFET 420, respectively.

The source of pMOSFET 415 is coupled to a node 425 that is coupled to VPOS, which is located at the highest position in circuit 400. The drain of pMOSFET 415 is coupled to a node 430 and the bulk of pMOSFET 415 is coupled to VPOS to ensure that there is no source-drain forward bias in pMOSFET 415.

Node 425 is coupled to a voltage source, load (Cload), and/or other capacitive device represented by a capacitor 435. In various embodiments, the voltage source, Cload, and/or other capacitive device represented by capacitor 435 comprises a voltage (VPOS) in the range of about 1.2 volts to about 4.0 volts. In one embodiment, the voltage source, Cload, and/or other capacitive device represented by capacitor 435 comprises a voltage of about 3.0 volts.

The drain of pMOSFET 420 is coupled to a node 440 that is coupled to VPWR and the bulk of pMOSFET 420 is coupled to VPOS to ensure that there is no source-drain forward bias in pMOSFET 420. The source of pMOSFET 420 is coupled to the drain of a pMOSFET 445 that acts a source follower (e.g., a common drain amplifier).

The bulk of pMOSFET 445 is coupled to VPOS to ensure that there is no source-drain forward bias in pMOSFET 445. The source of pMOSFET 445 is coupled to node 425 and the gate of pMOSFET 445 is coupled to a node 450 that is coupled to a resistor 455 (e.g., a low-pass filter).

Resistor 455 may be any resistive device known in the art or developed in the future. In various embodiments, resistor 455 may comprise a resistance in the range of about 50 kΩ to about 500 kΩ. Resistor 455 is also coupled to a capacitor 460 that is coupled to a node 465.

Capacitor 460 is configured to discharge the voltage source, Cload, and/or other capacitive device represented by capacitor 435. For example, capacitor 435 may represent an array of memory device and capacitor 460 is configured to discharge the array of memory devices during programming and erasing operations. Capacitor 460 is coupled to a node 465 that is coupled to node 440 and to the gate of an nMOSFET 470.

The source of nMOSFET 470 is coupled to node 430. The drain of nMOSFET 470 is coupled to a current source 475 (Idchg) that is coupled to ground and is configured to discharge capacitor 460. The bulk of nMOSFET 470 is coupled to ground to ensure that there is no source-drain forward bias in pMOSFET 470.

Current source 475 may be any type of current source known in the art or developed in the future. In one embodiment, current source 475 is a resistor coupled in series with the drain of nMOSFET 470. In another embodiment, current source 475 is a transistor (e.g., an nMOSFET).

In various embodiments, circuit 400 is configured to operate in a pre-charge mode and a discharge mode. In the precharge mode, circuit 400 is configured to discharge a voltage source, (Cload) and/or other capacitive device represented by capacitor 435 coupled (e.g., via node 425) to circuit 400 via capacitor 460. In the discharge mode, circuit 400 is configured to discharge capacitor 460 via current source 475.

In various embodiments, the size and/or rate (e.g., speed) at which capacitor 460 discharges the voltage source, Cload, and/or other capacitive device represented by capacitor 435 may be important. Specifically, capacitor 460 may include a size and/or rate of charge such that the voltage source, Cload, and/or other capacitive device represented by capacitor 435 is neither discharged too quickly nor too slowly. For example, it may be important not to discharge the voltage source, Cload, and/or other capacitive device represented by capacitor 435 too quickly so that a phenomena known as "bipolar snapback" is avoided or at least reduced. Furthermore, it may be important not to discharge the voltage source, Cload, and/or other capacitive device represented by capacitor 435 too slowly so that the performance of the voltage source, Cload, and/or other capacitive device represented by capacitor 435 is not adversely affected. In other words, capacitor 460 may include a size and/or rate of charge such that the voltage source, Cload, and/or other capacitive device represented by capacitor 435 is discharged within a predetermined amount of time.

In one embodiment, the predetermined amount of time at which the voltage source, Cload, and/or other capacitive device represented by capacitor 435 is discharged is in the range of about 5 μs to about 50 μs. That is, in one embodiment, capacitor 460 is configured to take at least 5 μs, but not longer than about 50 μs to discharge the voltage source, Cload, and/or other capacitive device represented by capacitor 435. Moreover, in various embodiments, capacitor 460 includes a capacitance in the range of about 2 pF to about 5 pF.

The following explanation of the operation of circuit 400 may be helpful in understanding circuit 400. However, the various embodiments of circuit 400 are not limited to the following explanation.

To enable the pre-charge mode, high voltage switch 410 provides a logic low signal (or 0 volt signal) to pMOSFET 415 via HVsw and provides a logic high signal (or 1.2 volt signal) to pMOSFET 420 via HVswb. The logic low signal turns ON pMOSFET 415 and current source 475 is turned OFF. A voltage pump (see voltage pump 520 in FIG. 5) coupled to node 425 applies a positive voltage (VPOS) to circuit 400 and node 430 will follow this voltage up and keep pMOSFET 445 OFF.

Node 470 will charge to a voltage around one pMOSFET threshold voltage below VPWR (1.2 volts). At this point, nMOSFET 470 is biased in the cutoff region of operation. With pMOSFET 415 ON and pMOSFET 445 OFF, the voltage at node 430 is at VPOS and capacitor 455 is "pre-charged."

In other words, nMOSFET 470 is always ON so, in pre-charge mode, discharge current source 475 (Idchg) is turned OFF. The source of nMOSFET 470 will discharge current source 475 until it reaches an nMOSFET threshold voltage below VPWR. At this point, Vgate-Vsource of nMOSFET 470 is greater than the threshold voltage of nMOSFET 470, which turns OFF nMOSFET 470.

pMOSFET 445 is OFF because pMOSFET 415 is ON and the gate and source of pMOSFET 445 are both shorted (i.e., Vgate-Vsource=1.2V), which guarantees that pMOSFET 445 is OFF. The voltage (VPOS) at node 425 pumped up to 4.0V and capacitor 455 (Cdchg) is pre-charged to 4.0V. Specifically, one terminal of capacitor 455 is at 0 volts and the other terminal is at 4.0 volts.

To enable the discharge mode, the voltage source connected to node 425 is shut OFF. High voltage switch 410 provides a logic high signal to pMOSFET 415 via HVsw, which turns OFF pMOSFET 415, and provides a logic low signal to pMOSFET 420 via HVswb. At this point, both nodes 430 and 425 are still at 4.0 volts, so pMOSFET 445 is still OFF and pMOSFET 420 is ON.

Discharge current source 475 is next turned ON. Furthermore, VPOS will follow the discharge of node 430 as it discharges through current source 475 since pMOSFET 445 forms a source follower device.

While the embodiment of circuit 400 illustrated in FIG. 4 has been described as utilizing MOSFET devices, circuit 400 is not limited to MOSFET devices. That is, various other embodiments of circuit 400 may utilize other types of switches, switching devices, and/or transistor devices (e.g., bipolar junction transistor devices, junction gate field-effect transistor devices, insulated gate bipolar transistor devices, etc.).

Figure 5:
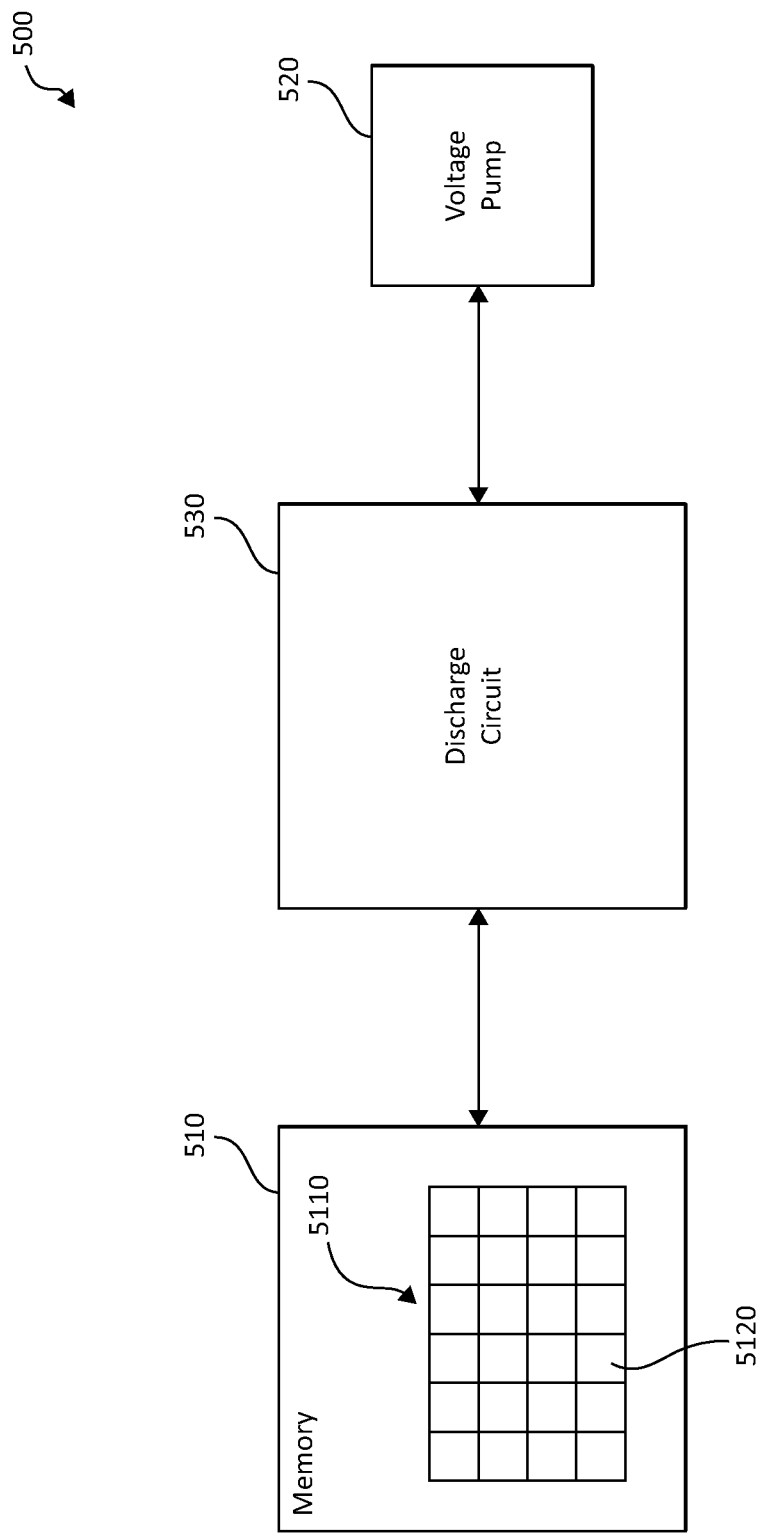
FIG. 5 is a block diagram of one embodiment of a memory system.

FIG. 5 is a block diagram of one embodiment of a memory system 500. At least in the illustrated embodiment, memory system 500 comprises a memory 510 and a voltage pump 520 coupled to a discharge circuit 530, which may be any one of circuit 100, circuit 200, circuit 300, or circuit 400 depending on the voltage utilized on memory 510 and/or the application of memory system 500.

Memory 510 may be any memory known in the art or developed in the future that comprises an array 5110 of memory devices 5120. The array of memory devices 5110 may comprise any number of memory devices 5120 suitable for a desired application of memory system 500.

In one embodiment, memory 510 comprises a voltage in the range of about −4.5 volts to about −3.0 volts. In another embodiment, memory 510 comprises a voltage in the range of about 1.2 volts to about 4.0 volts.

Memory 510 is configured to operate in three modes of operation. Specifically, memory 510 is configured to operate in a program mode, an erase mode, and a read mode.

Voltage pump 520 may be any voltage pump known in the art or developed in the future capable of providing a voltage (e.g. VPWR) to discharge circuit 520. In one embodiment, voltage pump 520 is configured to provide 1.2 volts to discharge circuit 530.

Discharge circuit 530, in one embodiment, is configured to determine which mode of operation memory 510 is currently operating. When discharge circuit 530 determines that memory 510 is operating in the program mode or in the erase mode, discharge circuit 530 is configured to enable the pre-charge mode to discharge current from array 5110 of memory devices 5120, as described above with reference to circuit 100, circuit 200, circuit 300, and circuit 400. In other words, array 5110 of memory devices 5120 is represented by capacitor 135, 235, 335, and 435 in circuit 100, circuit 200, circuit 330, and circuit 400, respectively, discussed above which discharges array 5110 of memory devices 5120 during the pre-charge mode of operation.

When discharge circuit 530 determines that memory 510 is operating in the read mode, discharge circuit 530 is configured to be OFF (e.g., not discharging array 5110 of memory devices 5120 and/or memory 510). Alternatively, when memory 510 determines that memory 510 is operating in the read mode, discharge circuit 530 in configured to operate in the discharge mode to discharge its internal capacitor (e.g., capacitor 160, capacitor 260, capacitor 360, and capacitor 460).

In one embodiment, discharge circuit 530 is configured to discharge array 5110 of memory devices 5120 within a pre-determined range of time. That is, discharge circuit 530 is configured to discharge array 5110 of memory devices 5120 so that array 5110 of memory devices 5120 is neither discharged too quickly nor too slowly to avoid "bipolar snapback" and performance issues, respectively, as discussed above.

Figure 6:
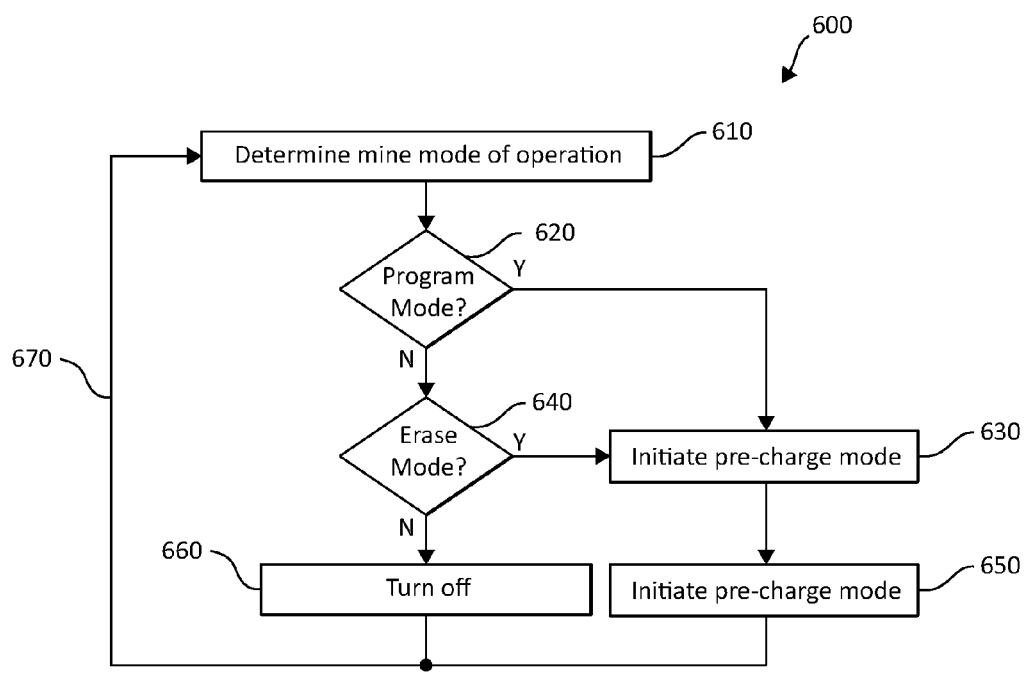
FIG. 6 is a flow diagram of one embodiment of a method for discharging voltage from load capacitance circuits.

Turning now to FIG. 6, FIG. 6 is a flow diagram of one embodiment of a method 600 for discharging voltage from load capacitance circuits. At least in the illustrated embodiment, method 600 begins by determining the operational mode (e.g., a program mode, an erase mode, and a read mode) of a memory (e.g., memory 510) (block 610).

Method 600 further comprises determining if the memory is operating in the program mode (block 620). If the memory is operating in the program mode, method 600 includes initiating a pre-charge mode (block 630). If the memory is not operating in the program mode, method 600 comprises determining if the memory is operating in the erase mode (block 640).

If the memory is operating in the erase mode, method 600 includes initiating the pre-charge mode (block 630). In one embodiment, the pre-charge mode comprises discharging an array of memory devices in the memory, via a capacitor (e.g., capacitor 160, capacitor 260, capacitor 360, and capacitor 460), within a predetermined range of time so that the array of memory devices is neither discharged too quickly nor too slowly to avoid "bipolar snapback" and performance issues, respectively, as discussed above.

In another embodiment, the pre-charge mode comprises discharging, via a capacitor (e.g., capacitor 160, capacitor 260, capacitor 360, and capacitor 460), a negative high voltage in the range of about −4.5 volts to about −3.0 volts from the memory. In yet another embodiment, the pre-charge mode comprises discharging, via a capacitor (e.g., capacitor 160, capacitor 260, capacitor 360, and capacitor 460), a positive high voltage in the range of about 1.2 volts to about 4.0 volts from the memory.

Method 600 further comprises initiating a discharge mode to discharge the capacitor (block 650). In one embodiment, the capacitor is discharged via a current source (e.g., current source 175, current source 275, current source 375, and current source 475). In another embodiment, the capacitor is discharged via a current source (e.g., current source 275 and current source 475) coupled to a low-pass filter (e.g., resistor 260 and resistor 460).

If the memory is not operating in the erase mode, method 600 comprises determining that the memory is operating in the read mode and turning OFF the pre-charge mode (block 660). Method 600 further comprises determining again the mode of operation of the memory after the discharge mode of block 650 and after the pre-charge mode is turned OFF (670).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

As will be appreciated by one of ordinary skill in the art, aspects of the present invention may be embodied as an apparatus, system, or method. Accordingly, aspects of the present invention may take the form of an entirely hardware embodiment or an embodiment combining hardware and software aspects that may all generally be referred to herein as a "circuit," "module," or "system."

Aspects of the present invention are described above with reference to flowchart illustrations and/or block diagrams of methods, apparatus, and systems according to various embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of apparatus, systems, and methods according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments have been illustrated in detail, one of ordinary skill in the art will appreciate that modifications and adaptations to those embodiments may be made without departing from the scope of the various embodiments as set forth in the following claims.

The invention claimed is:

1. A circuit for discharging voltage, comprising:
a node configured to be coupled to a voltage source;
a capacitor configured to discharge the voltage source;
a common drain amplifier device coupled between the node and the capacitor, the common drain amplifier configured to switchably couple the capacitor to the node; and
a current source coupled to the capacitor and configured to discharge the capacitor.

2. The circuit of claim 1, wherein the capacitor is in the range of about 2 pF to about 5 pF.

3. The circuit of claim 1, further comprising a resistor coupled in series between the capacitor and the common drain amplifier.

4. The circuit of claim 1, wherein the system is configured to operate in a pre-charge mode and a discharge mode.

5. The circuit of claim 4, wherein, in the pre-charge mode, the capacitor is coupled, via the source-follower device, to the node and discharges the voltage source.

6. The circuit of claim 5, wherein, in the discharge mode, the capacitor is decoupled, via the source-follower device, from the node and the current source discharges the capacitor.

7. The circuit of claim 6, further comprising a switching device configured to switch the system between the pre-charge mode and the discharge mode.

8. The circuit of claim 7, wherein the switching device is a high-voltage switch.

9. The circuit of claim 7, further comprising:
a first switch coupled between the node and the capacitor, the first switch controlled by the switching device; and
a second switch coupled between the current-follower device and an output of the capacitor, the second switch controlled by the switching device.

10. The circuit of claim 9, further comprising a third switch coupled between the node and the current source, the third switch controlled by the output of the capacitor.

11. The circuit of claim 10, wherein:
the first switch, the second switch, and the source-follower device are each n-channel metal oxide semiconductor field-effect transistors; and
the third switch is a p-channel metal oxide semiconductor field-effect transistor.

12. The circuit of claim 11, wherein:
voltage at the voltage source is on the range of about −4.5 volts to about −3.0 volts; and
the switching device is configured to provide voltage in the range of about 0 volts to about 1.2 volts to the first switch and the second switch to control the first switch and the second switch.

13. The circuit of claim 10, wherein:
the first switch, the second switch, and the source-follower device are each p-channel metal oxide semiconductor field-effect transistors; and
the third switch is an n-channel metal oxide semiconductor field-effect transistor.

14. The circuit of claim 13, wherein:
voltage at the voltage source is on the range of about 1.2 volts to about 4.0 volts; and
the switching device is configured to provide voltage in the range of about 0 volts to about 1.2 volts to the first switch and the second switch to control the first switch and the second switch.

15. A memory system, comprising:
an array of memory devices, the array of memory devices including a high voltage; and
a discharge circuit coupled to the array of memory devices, the discharge circuit comprising:
a high-voltage node coupled to the array of memory devices,
a capacitor,
a common drain amplifier coupled between the high-voltage node and the capacitor, the common drain amplifier configured to switchably couple the capacitor to the high-voltage node, and
a current source coupled to the capacitor and configured to discharge the capacitor, wherein:
the discharge circuit is configured to operate in a pre-charge mode to discharge the array of memory devices via the capacitor and in a discharge mode to discharge the capacitor via the current source.

16. The memory system of claim 15, wherein the discharge circuit is configured to discharge one of a negative high voltage and a positive high voltage from the array of memory devices.

17. A method for discharging a memory device, comprising:
discharging, via a capacitor coupled to the memory device, a high voltage from the memory device; and
discharging, via a current source coupled to the capacitor, the high voltage from the capacitor, wherein the capacitor is configured to discharge the high voltage within a predetermined range of time.

18. The method of claim 17, wherein discharging the high voltage from the memory device occurs in an amount of time in the range of about 5 µs to about 50 µs.

19. The method of claim 17, wherein:
discharging the high voltage from the memory device comprises discharging one of a negative high voltage and a positive voltage from the memory device; and
discharging the high voltage from the capacitor comprises discharging the one of the negative high voltage and the positive voltage from the capacitor.

20. The method of claim 17, wherein discharging the high voltage from the memory device comprises:
determining that the memory device is operating in one of a program mode and an erase mode; and
discharging the high voltage while the memory device is operating in the one of the program mode and the erase mode.

* * * * *